(12) United States Patent
Ning et al.

(10) Patent No.: US 11,914,479 B2
(45) Date of Patent: *Feb. 27, 2024

(54) METHOD FOR READING AND WRITING AND MEMORY DEVICE

(71) Applicant: CHANGXIN MEMORY TECHNOLOGIES, INC., Hefei (CN)

(72) Inventors: Shuliang Ning, Hefei (CN); Jun He, Hefei (CN); Zhan Ying, Hefei (CN); Jie Liu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 283 days.

This patent is subject to a terminal disclaimer.

(21) Appl. No.: 17/353,824

(22) Filed: Jun. 22, 2021

(65) Prior Publication Data

US 2021/0311836 A1 Oct. 7, 2021

Related U.S. Application Data

(63) Continuation of application No. PCT/CN2020/127531, filed on Nov. 9, 2020.

(30) Foreign Application Priority Data

Apr. 1, 2020 (CN) .......................... 202010250008.9

(51) Int. Cl.
*G06F 11/00* (2006.01)
*G06F 11/14* (2006.01)
(Continued)

(52) U.S. Cl.
CPC ........ *G06F 11/1451* (2013.01); *G06F 3/0619* (2013.01); *G06F 3/0659* (2013.01);
(Continued)

(58) Field of Classification Search
CPC ............. G06F 11/1451; G06F 11/1461; G06F 11/1048
See application file for complete search history.

(56) References Cited

U.S. PATENT DOCUMENTS 5,841,711 A 11/1998 Watanabe
5,996,096 A 11/1999 Dell et al.
(Continued)

FOREIGN PATENT DOCUMENTS

CN 1832049 A 9/2006
CN 101145372 A 3/2008
(Continued)

OTHER PUBLICATIONS

State Intellectual Property Office of the People's Republic of China, First Office Action issued in Application No. 202010250011.0, dated Feb. 15, 2023, 9 pages.
(Continued)

*Primary Examiner* — Amine Riad
(74) *Attorney, Agent, or Firm* — Kilpatrick Townsend & Stockton LLP

(57) ABSTRACT

The embodiments provide a method for reading and writing and a memory device. The method includes: applying a read command to the memory device, the read command pointing to address information; reading data to be read out from a memory cell corresponding to the address information pointed to by the read command; and storing the address information pointed to by the read command into a preset memory space if an error occurs in the data to be read out, and backing up the address information stored in the preset memory space into a non-volatile memory cell according to a preset rule.

15 Claims, 6 Drawing Sheets

(51) Int. Cl.
*G06F 11/10* (2006.01)
*G06F 3/06* (2006.01)

(52) U.S. Cl.
CPC ........ *G06F 3/0679* (2013.01); *G06F 11/1076* (2013.01); *G06F 2201/82* (2013.01)

(56) References Cited

U.S. PATENT DOCUMENTS

| | | | |
|---|---|---|---|
| 9,037,928 | B2 | 5/2015 | Kleveland et al. |
| 9,741,455 | B1 | 8/2017 | Park |
| 11,527,301 | B2 | 12/2022 | Ning et al. |
| 2002/0097613 | A1 | 7/2002 | Raynham |
| 2002/0169996 | A1 | 11/2002 | King et al. |
| 2003/0133336 | A1 | 7/2003 | Chen |
| 2003/0156469 | A1 | 8/2003 | Viehmann et al. |
| 2004/0003315 | A1 | 1/2004 | Lakhani et al. |
| 2006/0140027 | A1 | 6/2006 | Tominaga |
| 2007/0113155 | A1 | 5/2007 | Takahashi |
| 2007/0294570 | A1 | 12/2007 | Polisetti et al. |
| 2008/0181035 | A1 | 7/2008 | Kawasumi |
| 2010/0229033 | A1 | 9/2010 | Maeda et al. |
| 2010/0269000 | A1 | 10/2010 | Lee |
| 2010/0332895 | A1 | 12/2010 | Billing et al. |
| 2010/0332950 | A1 | 12/2010 | Billing et al. |
| 2011/0119558 | A1 | 5/2011 | Koshiyama et al. |
| 2012/0166710 | A1 | 6/2012 | Ou |
| 2012/0254511 | A1 | 10/2012 | Yeh |
| 2013/0179724 | A1 | 7/2013 | Cordero et al. |
| 2014/0075265 | A1 | 3/2014 | Hung et al. |
| 2014/0376320 | A1 | 12/2014 | Loh et al. |
| 2015/0019804 | A1 | 1/2015 | Nemazie et al. |
| 2015/0127972 | A1 | 5/2015 | Chun et al. |
| 2015/0143198 | A1 | 5/2015 | Chun et al. |
| 2015/0186198 | A1 | 7/2015 | Dong et al. |
| 2015/0293809 | A1 | 10/2015 | Liang et al. |
| 2015/0347254 | A1 | 12/2015 | Jones et al. |
| 2015/0363425 | A1 | 12/2015 | Li et al. |
| 2016/0147599 | A1 | 5/2016 | Kim |
| 2016/0357462 | A1 | 12/2016 | Nam et al. |
| 2016/0364153 | A1 | 12/2016 | Nam et al. |
| 2017/0123879 | A1 | 5/2017 | Donlin |
| 2017/0132075 | A1 | 5/2017 | Zastrow et al. |
| 2017/0139839 | A1 | 5/2017 | Ke |
| 2017/0262178 | A1 | 9/2017 | Hashimoto |
| 2017/0308433 | A1 | 10/2017 | Kwon et al. |
| 2017/0372799 | A1 | 12/2017 | Bacchus |
| 2018/0158535 | A1* | 6/2018 | Kim ................... G11C 29/783 |
| 2019/0129776 | A1 | 5/2019 | Hsiao et al. |
| 2019/0371391 | A1 | 12/2019 | Cha et al. |
| 2019/0377631 | A1* | 12/2019 | Hattori ............... G11C 13/0069 |
| 2019/0385693 | A1 | 12/2019 | Shin et al. |
| 2020/0004652 | A1 | 1/2020 | Niu et al. |
| 2021/0055981 | A1 | 2/2021 | Miller et al. |
| 2021/0311836 | A1 | 10/2021 | Ning et al. |

FOREIGN PATENT DOCUMENTS

| | | |
|---|---|---|
| CN | 101593157 A | 12/2009 |
| CN | 101777013 A | 7/2010 |
| CN | 101908023 A | 12/2010 |
| CN | 101937374 A | 1/2011 |
| CN | 101937725 A | 1/2011 |
| CN | 102004698 A | 4/2011 |
| CN | 102063940 A | 5/2011 |
| CN | 102203740 A | 9/2011 |
| CN | 102592680 A | 7/2012 |
| CN | 103019873 A | 4/2013 |
| CN | 103247345 A | 8/2013 |
| CN | 103269230 A | 8/2013 |
| CN | 103309775 A | 9/2013 |
| CN | 103778065 A | 5/2014 |
| CN | 103839591 A | 6/2014 |
| CN | 103955430 A | 7/2014 |
| CN | 103955431 A | 7/2014 |
| CN | 104063186 A | 9/2014 |
| CN | 105723344 A | 6/2016 |
| CN | 105740163 A | 7/2016 |
| CN | 105788648 A | 7/2016 |
| CN | 105868122 A | 8/2016 |
| CN | 105893178 A | 8/2016 |
| CN | 106569742 A | 4/2017 |
| CN | 106776362 A | 5/2017 |
| CN | 107247563 A | 10/2017 |
| CN | 107402836 A | 11/2017 |
| CN | 107766173 A | 3/2018 |
| CN | 110673980 A | 1/2020 |
| TW | 201706842 A | 2/2017 |
| WO | 2012019475 A1 | 2/2012 |

OTHER PUBLICATIONS

State Intellectual Property Office of the People's Republic of China, First Office Action issued in Application No. 202010250426.8, dated Feb. 16, 2023, 12 pages.
European Patent Office, Office Action Issued in Application No. 20928300.1, dated Feb. 22, 2023, Germany, 11 pages.
State Intellectual Property Office of the People's Republic of China, First Office Action Issued in related Application No. 202010249668.5, dated Jan. 12, 2023, 8 pages.
State Intellectual Property Office of the People's Republic of China, First Office Action Issued in related Application No. 202010249989.5, dated Jan. 19, 2023, 10 pages.
State Intellectual Property Office of the People's Republic of China, First Office Action Issued in related Application No. 202010250023.3, dated Jan. 19, 2023, 12 pages.
European Patent Office, Extended European Search Report Issued in Application No. 20926358.1, dated Jul. 17, 2023, Germany, 7 pages.
United States Patent and Trademark Office, Non-Final office action issued in related U.S. Appl. No. 17/363,013 dated Aug. 3, 2023, total 11 pages.
United States Patent and Trademark Office, Non-Final office action issued in related U.S. Appl. No. 17/310,495 dated Jul. 31, 2023, total 14 pages.
United States Patent and Trademark Office, Non-Final office action issued in related U.S. Appl. No. 17/342,498 dated Jul. 19, 2023, total 15 pages.
State Intellectual Property Office of the People's Republic of China, Office Action Issued in Application No. 202010250008.9, dated Jul. 1, 8 pages.
United States Patent and Trademark Office, Non-Final office action issued in related U.S. Appl. No. 17/396,692 dated Jul. 7, 2023, total 10 pages.
United States Patent and Trademark Office, Non-Final office action issued in related U.S. Appl. No. 17/347,525 dated Aug. 2, 2023, total 9 pages.

* cited by examiner

METHOD FOR READING AND WRITING AND MEMORY DEVICE

CROSS REFERENCE

This application is a continuation of PCT/CN2020/127531, filed Nov. 9, 2020, which claims priority to Chinese Patent Application No. 202010250008.9, titled "METHOD FOR READING AND WRITING AND MEMORY DEVICE" and filed on Apr. 1, 2020, the entire contents of which are incorporated herein by reference.

TECHNICAL FIELD

The present disclosure relates to the field of semiconductor memory technologies, and more particularly, to a method for reading and writing and a memory device.

BACKGROUND

Semiconductor memories are memory components for storing various data and information. With the increase in circuit complexity, various forms of memory devices are inevitably prone to produce defective or damaged memory cells during manufacturing or during use, resulting in reduced reliability of the semiconductor memory devices.

Therefore, how to improve the reliability of the memory devices has become an urgent problem to be solved at present.

SUMMARY

A technical problem to be solved by the present disclosure is to provide a method for reading and writing and a memory device to greatly improve the reliability of the memory device and prolong lifespan of the memory device.

To solve the above problem, the present disclosure provides a method for reading and writing. The method includes following steps. A read command is applied to the memory device, wherein the read command points to address information. Data to be read out is read from a memory cell corresponding to the address information pointed to by the read command. The address information pointed to by the read command is stored into a preset memory space if an error occurs in the data to be read out, and the address information stored in the preset memory space is backed up into a non-volatile memory cell according to a preset rule.

Further, the preset rule is a preset cycle or a preset action.

Further, the method for reading and writing also includes: loading the address information backed up in the non-volatile memory cell into the preset memory space after the memory device is enabled.

Further, the address information pointed to by the read command is not stored in the preset memory space if no error occurs in the data to be read out.

Further, the step of reading data to be read out from a memory cell corresponding to the address information pointed to by the read command also includes: reading, from the memory cell corresponding to the address information pointed to by the read command, a first error correction code (ECC) corresponding to the data to be read out. A method for determining whether an error occurs in the data to be read out includes: decoding the first ECC to determine whether the error occurs in the data to be read out.

Further, the method for reading and writing also includes following steps. A write command is applied to the memory device, and address information pointed to by the write command is compared with the address information stored in the preset memory space. A write operation is performed on a memory cell corresponding to the address information pointed to by the write command if the address information pointed to by the write command is different from the address information stored in the preset memory space. It is stopped performing the write operation on the memory cell corresponding to the address information pointed to by the write command if the address information pointed to by the write command is identical to the address information stored in the preset memory space.

Further, after the step of stopping performing the write operation on the memory cell corresponding to the address information pointed to by the write command, the method for reading and writing also includes: changing the address information pointed to by the write command to another address information.

Further, after the step of changing the address information pointed to by the write command to another address information, the method for reading and writing further includes following steps. The other address information is compared with the address information stored in the preset memory space. It is stopped performing the write operation on a memory cell corresponding to the other address information if the other address information is identical to the address information stored in the preset memory space. The write operation is performed on the memory cell corresponding to the other address information if the other address information is different from the address information stored in the preset memory space.

Further, the step of performing a write operation on the memory cell corresponding to the address information pointed to by the write command further includes: forming a second ECC corresponding to data to be written in the write operation, and writing the second ECC together with the data to be written into the memory cell corresponding to the address information pointed to by the write command.

Further, after the read command is applied to the memory device, and before the data to be read out is read from the memory cell corresponding to the address information pointed to by the read command, the method also includes: comparing the address information pointed to by the read command with the address information stored in the preset memory space; and performing a read operation on the memory cell corresponding to the address information pointed to by the read command if the address information pointed to by the read command is different from the address information stored in the preset memory space.

Further, if the address information pointed to by the read command is identical to the address information stored in the preset memory space, it is determined whether a write command has been executed on the address information pointed to by the read command after the address information pointed to by the read command is stored in the preset memory space. The read command points to address information pointed to by the write command to perform a read operation on a memory cell corresponding to the address information pointed to by the write command if a determination result is yes.

The present disclosure also provides a memory device, which includes: a command receiving unit, configured to receive a read/write command; a memory cell, configured to correspond to address information pointed to by the read/write command; an execution unit, configured to perform a read/write operation on the memory cell; a preset memory space, configured to store address information corresponding to a memory cell with data error; and a non-volatile memory cell, configured to back up the address information stored in the preset memory space according to a preset rule.

Further, the memory device also includes a loading unit, wherein the loading unit is connected to the preset memory space and the non-volatile memory cell, and the loading unit is configured to load the address information backed up in the non-volatile memory cell into the preset memory space.

Further, the memory device also includes an ECC decoding unit, wherein the ECC decoding unit is configured to decode a first ECC corresponding to data to be read out in the read operation and to form a second ECC corresponding to data to be written in the write operation.

Further, the memory device also includes a comparison unit, wherein the comparison unit is connected to the command receiving unit and the preset memory space, and the comparison unit is configured to compare the address information pointed to by the read/write command with the address information stored in the preset memory space.

Further, the execution unit is also connected to the comparison unit, and the execution unit is configured to perform a read/write operation on the memory cell corresponding to the address information pointed to by the read/write command, or to stop performing the read/write operation on the memory cell corresponding to the address information pointed to by the read/write command according to a result outputted by the comparison unit.

Further, the memory device also includes a determination unit, wherein the determination unit is connected to the command receiving unit and the execution unit, and the determination unit is configured to determine whether a write command has been executed on the address information pointed to by the read command after the address information pointed to by the read command is stored in the preset memory space.

Further, the memory device also includes a conversion unit, wherein the conversion unit is configured to change the address information pointed to by the read/write command to another address information after stopping performing the read/write operation on the memory cell corresponding to the address information pointed to by the read/write command.

Further, the memory device also includes a logic layer and at least one memory layer. The command receiving unit and the execution unit are arranged in the logic layer, the preset memory space is arranged in the logic layer or the memory layer, the memory cell is arranged in the memory layer, and the non-volatile memory cell is arranged in the memory layer or the logic layer.

The present disclosure has advantages as below. Address information corresponding to a memory cell with data error is differentiated from address information corresponding to a memory cell without data error by using the preset memory space, such that in a subsequent read/write operation, based on a fact whether the address information pointed to by the read/write command is located in the preset memory space, it may be determined whether to perform a read/write operation on the address information. In this way, data error or data loss can be avoided, and thus the reliability of the memory device can be greatly improved, and the lifespan of the memory device can be prolonged. In addition, according to the method for reading and writing provided by the present disclosure, the address information stored in the preset memory space is backed up into the non-volatile memory cell according to the preset rule, to serve as a basis for the subsequent read/write operation, which can prevent the address information having been stored in the preset memory space from being re-stored in the preset memory space after the memory device is powered on again. In this way, a running speed of the memory device can be greatly increased.

DETAILED DESCRIPTION

Embodiments of a method for reading and writing and a memory device provided by the present disclosure are described below in detail with reference to the accompanying drawings.

A common method for improving reliability of a memory device includes: encoding data as an error correction code (ECC) before the data is written into the memory device, and simultaneously storing the data and the ECC into the memory device. When reading, the data and the ECC are read simultaneously, and the ECC is decoded to restore data where an error likely occurs.

However, it is found that the ECC can only correct data when the data is read, and in a memory there still exists a memory cell with data error. In a subsequent data storage process, if at least one memory cell with data error reoccurs in a memory segment corresponding to the above memory cell with data error, in this memory segment there may exist at least two memory cells with data error. However, the ECC will be unable to correct the error, causing this memory segment to be unserviceable, or even causing the memory device to be unserviceable, thereby having a negative effect on the reliability and lifespan of the memory device.

By study, it is found that when a user uses the memory device, a basis can be provided for performing a subsequent read/write operation by differentiating the memory cell with data error in real time, which can greatly improve the reliability of the memory device. Therefore, the present disclosure provides a method for reading and writing, which not only can differentiate a memory cell with data error in real time, but also can back up address information of the memory cell into a non-volatile memory cell according to a preset rule.

Figure 1:
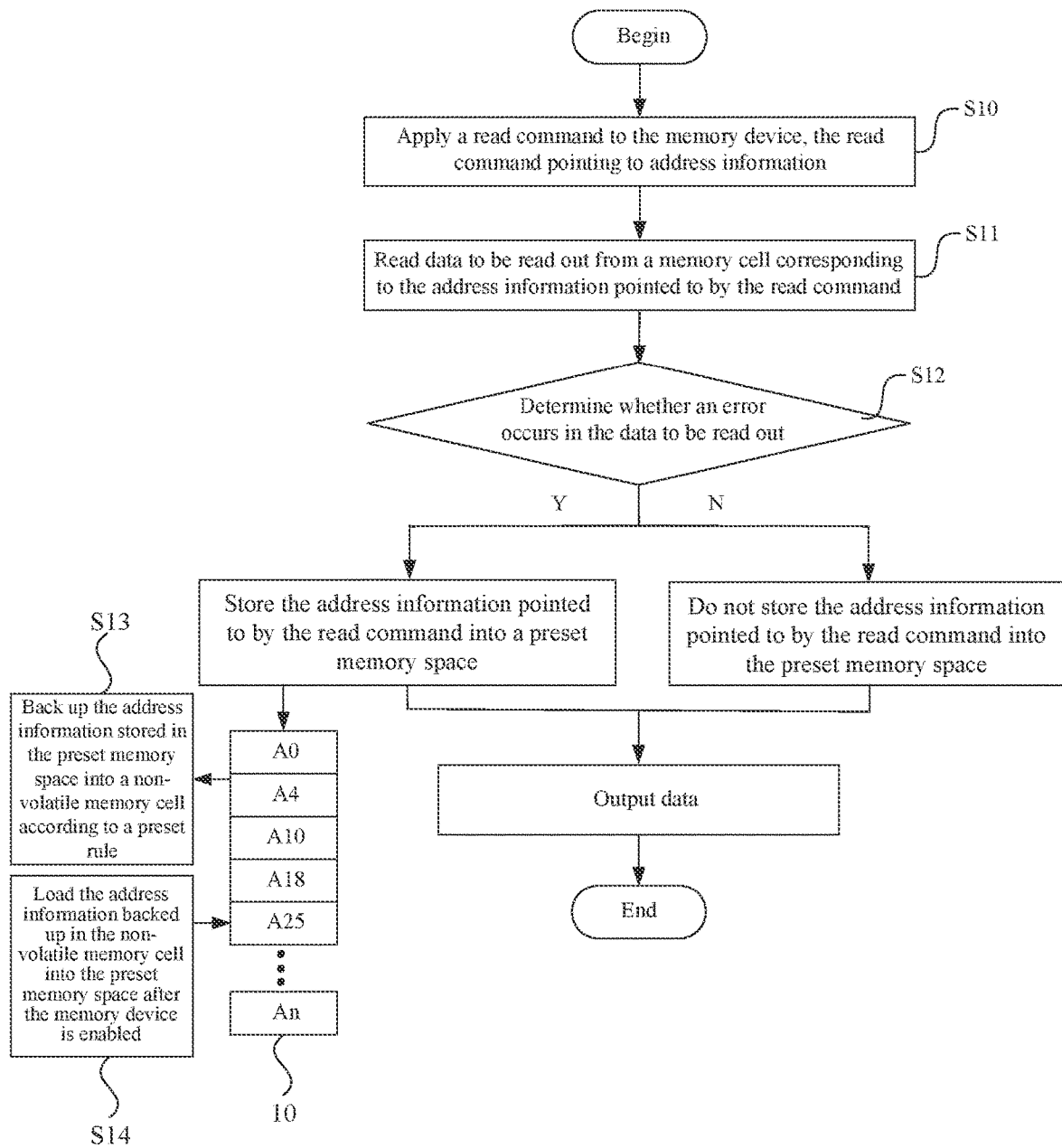
FIG. 1 is a schematic flow diagram of a method for reading and writing according to a first embodiment of the present disclosure.

In a first embodiment of the method for reading and writing provided by the present disclosure, when performing a read operation, address information corresponding to a memory cell where an error occurs in data to be read out is stored in a preset memory space to differentiate the memory cell where the error occurs in the data to be read out from a memory cell where no error occurs in the data to be read out. In some embodiments, with reference to FIG. 1, a schematic flow diagram of the method for reading and writing according to the first embodiment of the present disclosure is illustrated, and the method for reading and writing includes following steps.

In Step S10, a read command is applied to a memory device, wherein the read command points to address information. For example, the address information pointed to by the read command is denoted by A0.

In Step S11, data to be read out is read from a memory cell corresponding to the address information pointed to by the read command. For example, data to be read out is read from a memory cell corresponding to the address information A0.

In Step S12, it is determined whether an error occurs in the data to be read out.

If an error occurs in the data to be read out, this means that the memory cell is invalid. In this case, the address information pointed to by the read command is stored into a preset memory space 10.

For example, if an error occurs in the data to be read out read from the memory cell corresponding to the address information A0 pointed to by a read command, the address information A0 pointed to by the read command is stored into the preset memory space 10. If an error occurs in the data to be read out read from a memory cell corresponding to address information A4 pointed to by a read command, the address information A4 pointed to by the read command is stored into the preset memory space 10.

The preset memory space 10 may be a structure having memory function known to those skilled in the art, such as a static random access memory (SRAM), a dynamic random access memory (DRAM), a magnetic random access memory (MRAM), a register, a latch, and a flip-flop, etc.

If no error occurs in the data to be read out, this means that the memory cell is valid. In this case, the address information pointed to by the read command is not stored into the preset memory space 10.

For example, if no error occurs in the data to be read out read from a memory cell corresponding to address information A1 pointed to by a read command, the address information A1 pointed to by the read command is not stored into the preset memory space 10. If no error occurs in the data to be read out read from a memory cell corresponding to address information A2 pointed to by a read command, the address information A2 pointed to by the read command is not stored into the preset memory space 10.

Furthermore, the method for reading and writing provided by the present disclosure also includes a step as below. In Step S13, the address information stored in the preset memory space 10 is backed up into the non-volatile memory cell according to a preset rule.

The preset rule may be a preset cycle or a preset action.

The preset cycle may be a preset time cycle after the memory device is powered on. For example, after the memory device is powered on, the address information stored in the preset memory space 10 is backed up into the non-volatile memory cell in a cycle of ten minutes. That is, after the memory device is powered on, the address information stored in the preset memory space 10 is backed up into the non-volatile memory cell every ten minutes. Alternatively, the address information stored in the preset memory space 10 is backed up into the non-volatile memory cell in a cycle of one hour. That is, after the memory device is powered on, the address information stored in the preset memory space 10 is backed up into the non-volatile memory cell every one hour.

The preset action may be an operation received by the memory device. For example, the preset action may be an operation of shutting down the memory device, an operation of restarting the memory device, and a trigger operation set by a user or system including backing up the address information and marking instructions, etc. The trigger operation may be any operation of issuing a trigger instruction, such as an operation of clicking a certain trigger button by the user, or an operation of disabling a certain trigger button, which is not limited in the present disclosure.

According to the method for reading and writing provided by the present disclosure, address information stored in the preset memory space 10 is backed up into the non-volatile memory cell. If the memory device is powered down, the address information may still be recorded in the non-volatile memory cell and is not erased, such that the address information may be used as a basis for a subsequent read/write operation.

Further, the method for reading and writing provided by the present disclosure also includes following step. In Step S14, the address information backed up in the non-volatile memory cell is loaded into the preset memory space 10 after the memory device is enabled (that is, after the memory device is powered on again). The address information loaded into the preset memory space 10 serves as an initial reference for the subsequent read/write operation, which can prevent the address information having been stored in the preset memory space 10 before the memory device is powered down from being re-stored in the preset memory space 10 after the memory device is powered on again. In this way, the running speed of the memory device is greatly increased.

Further, the present disclosure also provides a method for determining whether an error occurs in the data to be read out. In some embodiments, the step of reading data to be read out from a memory cell corresponding to the address information pointed to by the read command further includes: reading, from the memory cell corresponding to the address information pointed to by the read command, a first error correction code (ECC) corresponding to the data to be read out. For example, number of bits of data read from the memory cell corresponding to the address information pointed to by the read command is 64b+8b, wherein 64b represents the number of bits of the data to be read out, and 8b represents the number of bits of the first ECC. According to a corresponding algorithm, the first ECC is decoded to restore data where an error likely occurs. The algorithm belongs to the existing technologies, and thus is not to be described in detail. Therefore, it may be determined whether an error occurs in the data to be read out by decoding the first ECC.

The present disclosure enumerates a method for determining whether an error occurs in the data to be read out by decoding the first ECC. This method includes following steps. The data to be read out is re-encoded to form a new ECC, and an XOR comparison is performed between the new ECC and the first ECC. If the new ECC is consistent with the first ECC in each bit, this means that no error occurs in the data to be read out, and the memory cell is valid. In this case, the address information corresponding to the memory cell is not stored into the preset memory space 10. If the new ECC is inconsistent with the first ECC, this means that an error occurs in the data to be read out, and the memory cell is invalid. In this case, the address information corresponding to the memory cell is stored into the preset memory space 10.

If no error occurs in the data to be read out, the data to be read out is used as output data of the memory device. If an error occurs in the data to be read out, the first ECC may be employed to store data, and the stored data is used as the output data of the memory device.

According to the method for reading and writing provided by the present disclosure, address information corresponding to a memory cell with data error is differentiated from address information corresponding to a memory cell without data error by using the preset memory space 10, such that in a subsequent read/write operation, based on a fact whether the address information pointed to by the read/write command is located in the preset memory space 10, it may be determined whether to perform a read/write operation on the address information. In this way, data error or data loss can be avoided, and thus the reliability of the memory device can be greatly improved, and the lifespan of the memory device can be prolonged.

Further, according to the method for reading and writing provided by the present disclosure, the address information stored in the preset memory space is backed up into the non-volatile memory cell according to the preset rule, and the address information backed up in the non-volatile memory cell is loaded into the preset memory space after the memory device is powered on again. The address information loaded into the preset memory space serves as an initial reference for the subsequent read/write operation, which can prevent the address information having been stored in the preset memory space before the memory device is powered down from being re-stored in the preset memory space after the memory device is powered on again. In this way, the running speed of the memory device is greatly increased.

The method for reading and writing provided by the present disclosure also provides a second embodiment. After applying a read command to the memory device, and before reading data to be read out from a memory cell corresponding to the address information pointed to by the read command, the method for reading and writing also includes a comparison step. In some embodiments, with reference to FIG. 2, a schematic flow diagram of the method for reading and writing according to the second embodiment of the present disclosure is illustrated.

In Step S20, a read command is applied to the memory device, wherein the read command points to address information.

In Step S21, the address information pointed to by the read command is compared with the address information stored in the preset memory space 20. That is, it is determined whether the address information pointed to by the read command is identical to the address information stored in the preset memory space 20.

If the address information pointed to by the read command is different from the address information stored in the preset memory space 20, this means that the address information pointed to by the read command is not stored in the preset memory space 20. In this case, the memory cell corresponding to the address information pointed to by the read command is a valid memory cell, and a read operation is performed on the memory cell corresponding to the address information pointed to by the read command, i.e., Step S22 is performed.

For example, the address information pointed to by the read command is denoted by A1, and the address information A1 pointed to by the read command is compared with the address information stored in the preset memory space 20. If the address information A1 pointed to by the read command is different from any address information stored in the preset memory space 20, this means that the address information A1 pointed to by the read command is not stored into the preset memory space 20. In this case, the read operation is performed on the memory cell corresponding to the address information A1 pointed to by the read command, i.e., Step S22 is performed. In Step S22, the read command points to the address information A1.

Figure 2:
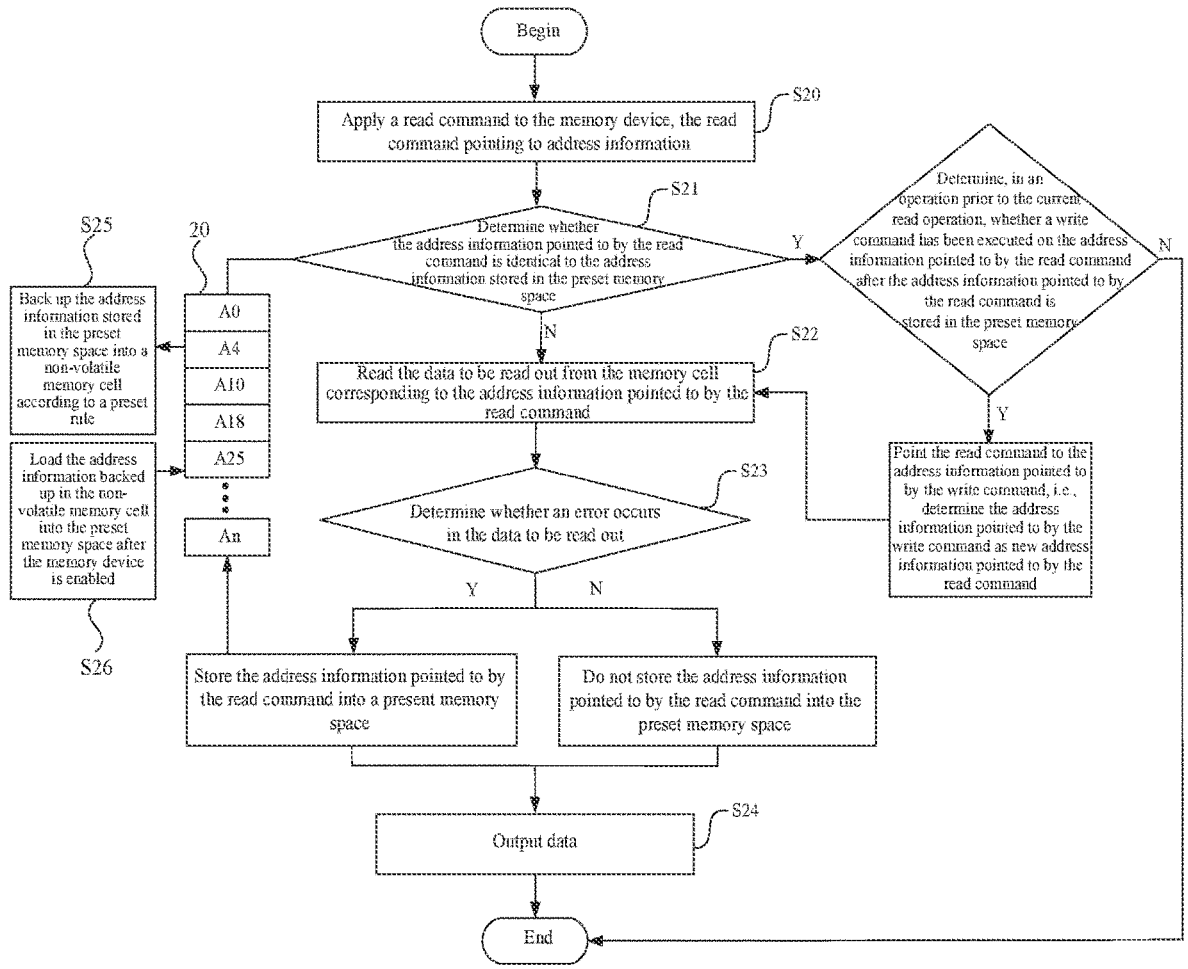
FIG. 2 is a schematic flow diagram of a method for reading and writing according to a second embodiment of the present disclosure.

If the address information pointed to by the read command is identical to the address information stored in the preset memory space 20, this means that the address information pointed to by the read command is not stored into the preset memory space 20, and the memory cell corresponding to the address information pointed to by the read command is an invalid memory cell. In this case, it is determined, in an operation prior to the current read operation, whether a write command has been executed on the address information pointed to by the read command after the address information pointed to by the read command is stored in the preset memory space 20. If a determination result is yes, the read command points to the address information pointed to by the write command, i.e., the address information pointed to by the write command is determined as new address information pointed to by the read command, and Step S22 is performed on the new address information. If the determination result is no, there are two processing modes as below. In one processing mode as shown in FIG. 2 of this embodiment, the read operation is stopped. In the other processing mode, it is continued to perform the read operation, and the data restored by using the first ECC is used as the output data of the memory device.

For example, if the address information A4 pointed to by the read command is identical to the address information stored in the preset memory space 20, this means that the address information A4 pointed to by the read command is stored in the preset memory space 20. In this case, it is determined, in an operation prior to the current read operation, whether a write command has been executed on the address information A4 pointed to by the read command after the address information A4 pointed to by the read command is stored in the preset memory space 20. If the determination result is yes, and the write command points to another address information A5, the read command points to the address information A5 pointed to by the write command, to perform the read operation on the memory cell corresponding to the address information A5 pointed to by the read command, i.e., Step S22 is performed. In Step S22, the address information pointed to by the read command is the address information A5. Reference is made to a third embodiment for implementation of the write command. If the determination result is no, the read operation is stopped.

In Step S22, the data to be read out is read from the memory cell corresponding to the address information pointed to by the read command. For example, the data to be read out is read from the memory cell corresponding to the address information A1 pointed to by the read command. This step is the same as Step S11 in the first embodiment.

In Step S23, it is determined whether an error occurs in the data to be read out. This step is the same as Step S12 in the first embodiment. If an error occurs in the data to be read out, this means that the memory cell is invalid. In this case, the address information pointed to by the read command is stored into the preset memory space 20. However, if no error occurs in the data to be read out, this means that the memory cell is valid. In this case, the address information pointed to by the read command is not stored into the preset memory space 20.

In Step S24, data is outputted.

In Step S25, the address information stored in the preset memory space 20 is backed up into the non-volatile memory cell according to a preset rule. This step is the same as Step S13, and the preset rule may be a preset cycle or a preset action.

In Step S26, the address information backed up in the non-volatile memory cell is loaded into the preset memory space 20 after the memory device is enabled. This step is the same as Step S14. The address information loaded into the preset memory space 20 serves as an initial reference for a subsequent read/write operation, which can prevent the address information having been stored in the preset memory space 20 before the memory device is powered down from being re-stored in the preset memory space 20 after the memory device is powered on again. In this way, the running speed of the memory device is greatly increased.

In the second embodiment, after a read command is applied to the memory device, address information pointed to by the read command is compared with the address information stored in the preset memory space 20 to determine whether the address information pointed to by the read command is located in the preset memory space 20, such that the read command may be selectively executed on a memory cell corresponding to the address information pointed to by the read command. In this way, the reliability of the memory device can be improved. Furthermore, after the data to be read out is read out, it may be selected whether to store the address information of the memory cell into the preset memory space 20 according to a fact whether an error occurs in the data to be read out, to provide a basis of determination for the subsequent read/write operation.

Figure 3:
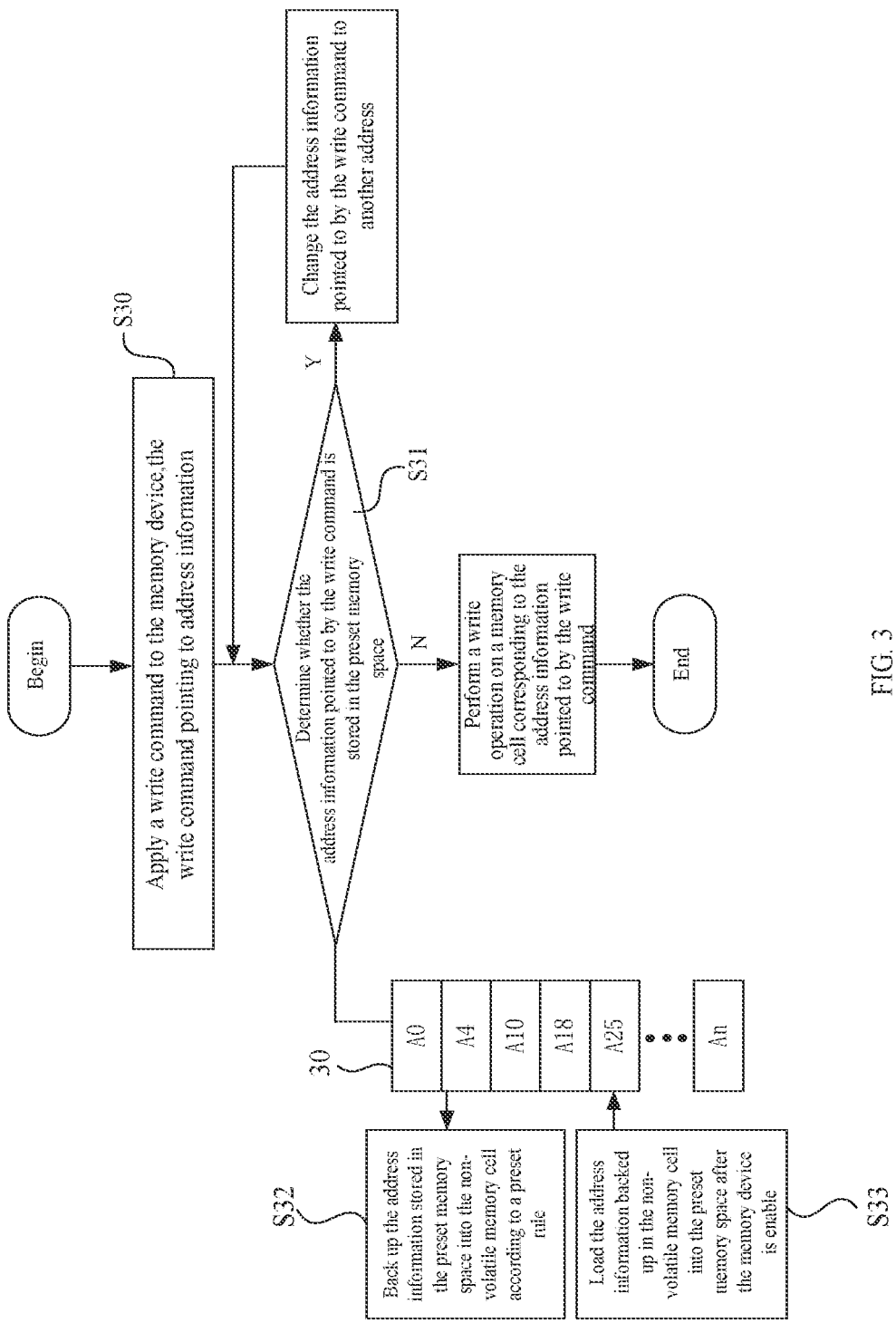
FIG. 3 is a schematic flow diagram of a method for reading and writing according to a third embodiment of the present disclosure.

The method for reading and writing provided by the present disclosure also provides a third embodiment. In the third embodiment, a write operation is performed on the memory device. In some embodiments, with reference to FIG. 3, a schematic flow diagram of the method for reading and writing according to the third embodiment of the present disclosure is illustrated.

In Step S30, a write command is applied to the memory device, wherein the write command points to address information. For example, a write command is applied to the memory device, wherein the write command points to address information A0.

In Step S31, the address information pointed to by the write command is compared with the address information stored in the preset memory space 30. That is, it is determined whether the address information pointed to by the write command is stored into the preset memory space 30.

If the address information pointed to by the write command is different from the address information stored in the preset memory space 30, this means that the address information pointed to by the write command is not stored into the preset memory space 30. In this case, a write operation is performed on a memory cell corresponding to the address information pointed to by the write command. If the address information pointed to by the write command is identical to the address information stored in the preset memory space 30, this means that the address information pointed to by the write command is stored into the preset memory space 30. In this case, it is stopped performing the write operation on the memory cell corresponding to the address information pointed to by the write command.

For example, the address information pointed to by the write command is address information A1, and the address information A1 is compared with the address information stored in the preset memory space 30. If the address information A1 is different from any address information stored in the preset memory space 30, this means that the address information A1 pointed to by the write command is not stored into the preset memory space 30. In this case, a write operation is performed on the memory cell corresponding to the address information A1 pointed to by the write command.

For another example, the address information pointed to by the write command is address information A4, and the address information A4 is compared with the address information stored in the preset memory space 30. If the address information A4 is identical to the address information stored in the preset memory space 30, this means that the address information A4 pointed to by the write command is stored into the preset memory space 30. In this case, the write operation is performed on the memory cell corresponding to the address information A4 pointed to by the write command.

In Step S32, the address information stored in the preset memory space 30 is backed up into the non-volatile memory cell according to a preset rule. This step is the same as Step S13, and the preset rule may be a preset cycle or a preset action.

In Step S33, the address information backed up in the non-volatile memory cell is loaded into the preset memory space 30 after the memory device is enabled. This step is the same as Step S14. The address information loaded into the preset memory space 30 serves as an initial reference for a subsequent read/write operation, which can prevent the address information having been stored in the preset memory space 30 before the memory device is powered down from being re-stored in the preset memory space 30 after the memory device is powered on again. In this way, the running speed of the memory device is greatly increased.

Further, in this third embodiment, after the step of stopping performing the write operation on the memory cell corresponding to the address information pointed to by the write command, the method for reading and writing also includes: changing the address information pointed to by the write command to another address information. After this step is performed, the other address information is compared with the address information stored in the preset memory space 30. This comparison method is the same as Step S31. It is stopped performing the write operation on a memory cell corresponding to the other address information if the other address information is identical to the address information stored in the preset memory space 30. However, if the other address information is different from the address information stored in the preset memory space 30, the write operation is performed on the memory cell corresponding to the other address information.

For example, after the step of stopping performing the write operation on the memory cell corresponding to the address information A0 pointed to by the write command, the address information A0 pointed to by the write command is changed to another address information A1. That is, after this step is performed, the write command points to the address information A1. Further, the address information A1 pointed to by the write command is compared with the address information stored in the preset memory space 30. That is, it is determined whether the address information A1 is stored into the preset memory space 30. For example, in this embodiment, the address information A1 is different from any address information stored in the preset memory space 30, and this means that the address information A1 is not stored into the preset memory space 30. In this case, the write operation is performed on the memory cell corresponding to the address information A1. For example, in other embodiments, the address information A1 is identical to the address information stored in the preset memory space 30, and this means that the address information A1 is stored into the preset memory space 30. In this case, it is stopped performing the write operation on the memory cell corresponding to the address information A1, the address information pointed to by the write command is changed to address information A2, and the address information A2 is compared with the address information stored in the preset memory space 30. That is, it is determined whether the address information A2 is stored into the preset memory space 30. The above operations are not stopped until the address information pointed to by the write command is different from any address information stored in the preset memory space 30.

Further, in this third embodiment, the method for reading and writing also includes: forming a second ECC corresponding to data to be written in the write operation, and writing the second ECC together with the data to be written into the memory cell corresponding to the address information pointed to by the write command. When reading data in the memory cell, both the data and the second ECC are read simultaneously, and the second ECC is decoded to restore data where an error likely occurs.

In this third embodiment, according to the method for reading and writing provided by the present disclosure, after a write command is applied to the memory device, the address information pointed to by the write command is compared with the address information stored in the preset memory space 30 to serve as a basis for determining whether to perform the write operation on a memory cell, thereby avoiding performing the write operation on an invalid memory cell. In this way, the reliability of the memory device is improved, and the lifespan of the memory device is prolonged.

The present disclosure also provides a memory device that can implement the above method for reading and writing. The memory device includes, but is not limited to, a volatile memory such as a dynamic random access memory (DRAM) and a static random access memory (SRAM), and to a non-volatile memory such as an NAND flash memory, an NOR flash memory, a ferroelectric random access memory (FeRAM), a resistance random access memory (RRAM), a magnetic random access memory (MRAM), and a phase change random access memory (PCRAM), etc.

Figure 4:
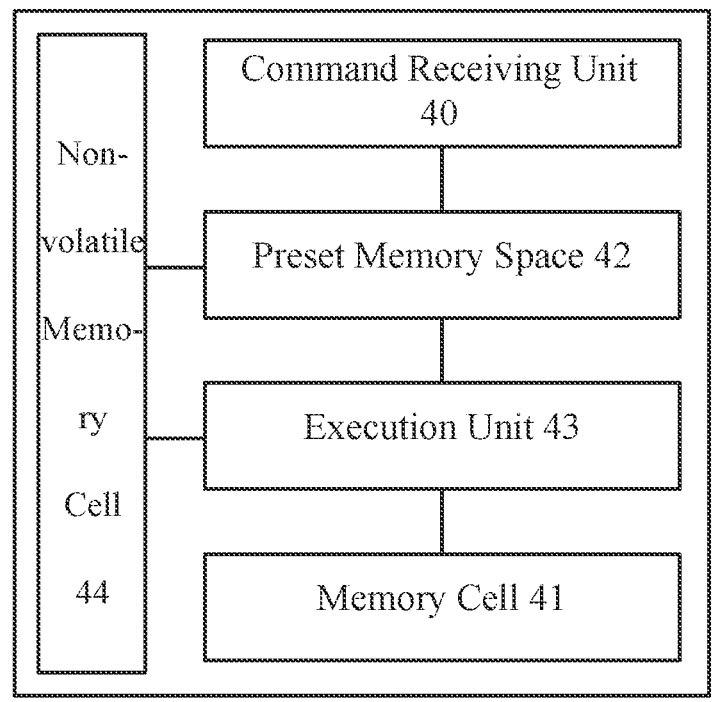
FIG. 4 is a schematic structural diagram of a memory device according to a first embodiment of the present disclosure.

With reference to FIG. 4, a schematic structural diagram of the memory device according to a first embodiment of the present disclosure is illustrated. The memory device includes: a command receiving unit 40, a memory cell 41, a preset memory space 42, an execution unit 43, and a non-volatile memory cell 44.

The command receiving unit 40 is configured to receive a read/write command applied to the memory device, and address information pointed to by the read/write command.

The memory cell 41 corresponds to the address information pointed to by the read/write command, and is configured to store data. In the present disclosure, the memory cell 41 may be a memory unit well known to those skilled in the art, such as a basic memory cell, a memory segment, memory pages, and memory blocks, which are not limited by the present disclosure.

The preset memory space 42 is configured to store address information corresponding to a memory cell with data error. The preset memory space 42 may be a structure having memory function known to those skilled in the art, such as a static random access memory (SRAM), a dynamic random access memory (DRAM), a magnetic random access memory (MRAM), a register, a latch, and a flip-flop, etc.

The execution unit 43 is configured to perform a read/write operation on the memory cell 41. The execution unit 43 is also connected to the preset memory space 42, and the execution unit 43 is configured to perform a read/write operation on the memory cell corresponding to the address information pointed to by the read/write command, or to stop performing the read/write operation on the memory cell corresponding to the address information pointed to by the read/write command according to the address information stored in the preset memory space 42.

In some embodiments, if the address information pointed to by the read/write command is different from any address information stored in the preset memory space 42, the execution unit 43 performs the read/write operation on the memory cell corresponding to the address information. If the address information pointed to by the read/write command is identical to the address information stored in the preset memory space 42, the execution unit 43 stops performing the read/write operation on the memory cell corresponding to the address information.

The non-volatile memory cell 44 is configured to back up the address information stored in the preset memory space according to a preset rule.

The non-volatile memory 44 may be a non-volatile memory structure such as NAND, NOR, FeRAM, RRAM, MRAM, and PCRAM, etc.

The non-volatile memory cell 44 is connected to the execution unit 43, and the execution unit 43 controls the address information stored in the preset memory space 42 to be backed up into the non-volatile memory cell 44 according to a preset rule. The preset rule may be a preset cycle or a preset action. Further, when the preset action is a trigger action inputted by the user, the command receiving unit 40 can receive the trigger action, and the execution unit 43 can control the address information stored in the preset memory space 42 to be backed up into the non-volatile memory cell 44 according to the trigger action.

Further, the execution unit 43 also can control the address information backed up in the non-volatile memory cell 44 to be loaded into the preset memory space 42. For example, after the memory device is enabled, the execution unit 43 controls the address information backed up in the non-volatile memory cell 44 to be loaded into the preset memory space 42, to serve as a basis for the subsequent read/write operation, which can prevent the address information having been stored in the preset memory space 42 from being re-stored in the preset memory space 42 after the memory device is powered on again. Therefore, the running speed of the memory device is greatly increased.

It is to be noted that the execution unit 43 may also be directly connected to the command receiving unit 40, which is not limited in the present disclosure, and those skilled in the art may select a connection mode according to their needs.

Figure 5:
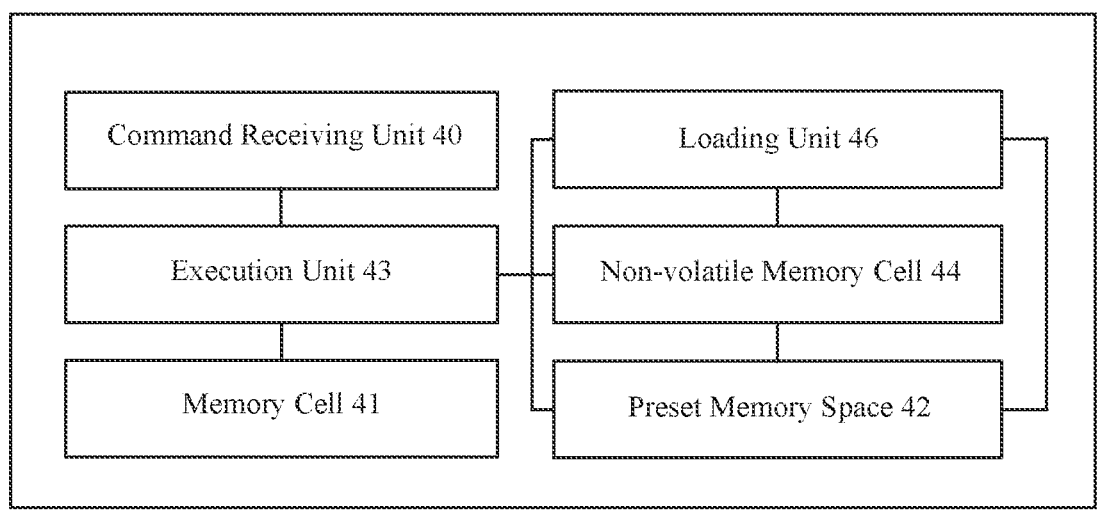
FIG. 5 is a schematic structural diagram of a memory device according to a second embodiment of the present disclosure.

Further, the memory device of the present disclosure also provides a second embodiment. With reference to FIG. 5, a schematic structural diagram of the memory device according to the second embodiment of the present disclosure is illustrated. The second embodiment differs from the first embodiment in that the memory device also includes a loading unit 46.

The loading unit 46 is connected to the preset memory space 42 and the non-volatile memory cell 44, and the loading unit 46 is configured to load the address information backed up in the non-volatile memory cell 44 into the preset memory space 42. Further, the loading unit 46 is also connected to the execution unit 43, and the execution unit 43 controls the loading unit 46 to load the address information backed up in the non-volatile memory cell 44 into the preset memory space 42. For example, after the memory device is enabled, the execution unit 43 controls the loading unit 46 to load the address information backed up in the non-volatile memory cell 44 into the preset memory space 42, to serve as a basis for a subsequent read/write operation, which can prevent the address information having been stored in the preset memory space 42 from being re-stored in the preset memory space 42 after the memory device is powered on again. Therefore, the running speed of the memory device is greatly increased.

Figure 6:
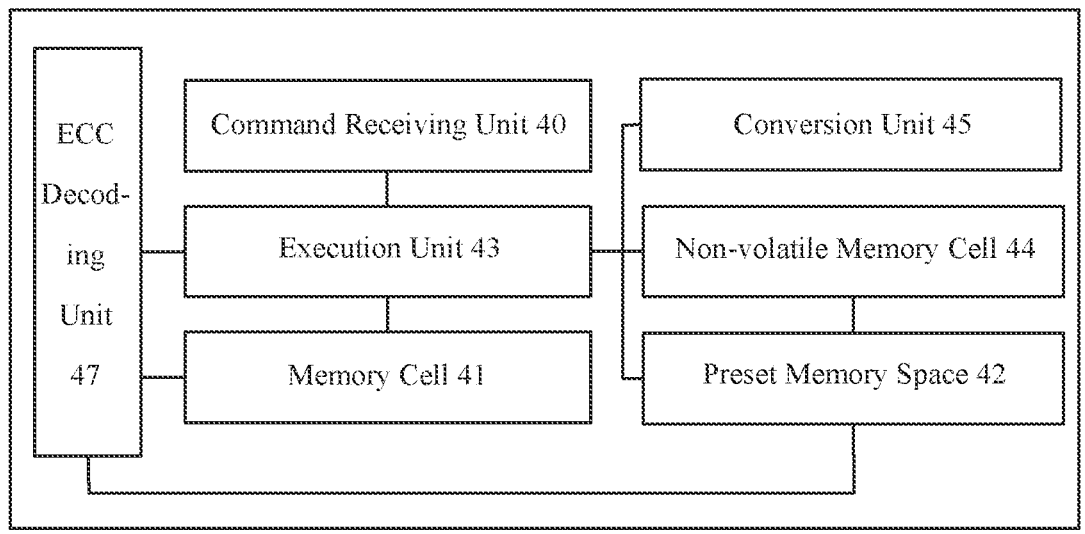
FIG. 6 is a schematic structural diagram of a memory device according to a third embodiment of the present disclosure.

Further, the memory device of the present disclosure also provides a third embodiment. With reference to FIG. 6, a schematic structural diagram of the memory device according to the third embodiment of the present disclosure is illustrated. The third embodiment differs from the first embodiment in that the memory device also includes an ECC decoding unit 47.

The ECC decoding unit 47 is connected to the execution unit 43, the memory cell 41, and the preset memory space 42.

The ECC decoding unit 47 is configured to decode the first ECC corresponding to the data to be read out in the read operation to restore data where an error likely occurs. Furthermore, it may be determined whether to store the address information into the preset memory space 42 based on a fact whether the ECC decoding unit 47 restores the data. The ECC decoding unit 47 is also configured to form a second ECC corresponding to data to be written in the write operation.

In some embodiments, in this embodiment, the command receiving unit 40 receives a write command. When performing the write operation on the memory cell corresponding to the address information pointed to by the write command, the ECC decoding unit 47 forms an ECC corresponding to data to be written in the write operation, and stores the ECC into the memory cell 41 corresponding to the address information pointed to by the write command. After the write operation is completed, when a subsequent read operation is performed on the memory cell corresponding to the address information, the ECC decoding unit 47 decodes the ECC. It may be determined whether an error occurs in the data to be read out read by the read operation according to decoding of the ECC decoding unit 47, and then it is determined whether the address information needs to be stored into the preset memory space 42.

Further, in this embodiment, it may be determined whether the address information needs to be stored into the preset memory space 42 based on a fact whether the ECC decoding unit 47 restores the data. In some embodiments, if the ECC decoding unit 47 decodes the ECC and restores the data, this means that an error occurs in the data to be read out read by the read operation. In this case, the address information of the memory cell is stored into the preset memory space 42. If the ECC decoding unit 47 decodes the ECC, but does not restore the data, this means that no error occurs in the data to be read out read by the read operation. In this case, the address information is not stored into the preset memory space 42.

In other embodiments of the present disclosure, the ECC decoding unit 47 decodes the ECC. Although the ECC decoding unit 47 does not restore the data, it may be still determined that an error occurs in the data to be read out read by the read operation according to decoding of the ECC decoding unit 47. In this case, the address information of the memory cell is stored into the preset memory space 42.

Further, in the third embodiment of the memory device, the memory device also includes a conversion unit 45. The conversion unit 45 may be connected to the execution unit 43. After stopping performing the read/write operation on the memory cell corresponding to the address information, the conversion unit 45 changes the address information pointed to by the read/write command to another address information. The execution unit 43 performs the read/write operation on the other address information according to mark information of a marking unit.

Figure 7:
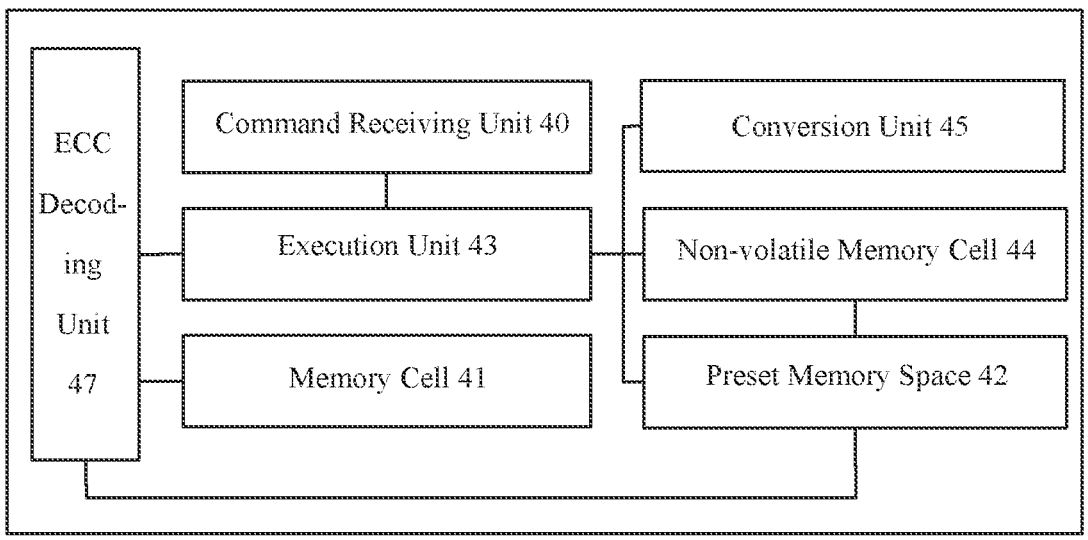
FIG. 7 is a schematic structural diagram of a memory device according to a fourth embodiment of the present disclosure.

In the third embodiment, the execution unit 43 not only is connected to the ECC decoding unit 47, but also is connected to the memory cell 41. However, in a fourth embodiment of the present disclosure, with reference to FIG. 7, a schematic structural diagram of the memory device according to the fourth embodiment, the execution unit 43 is connected to the ECC decoding unit 47, and the ECC decoding unit 47 is further connected to the memory cell 41. It is to be understood that different connection relationships may be selected according to different needs.

Figure 8:
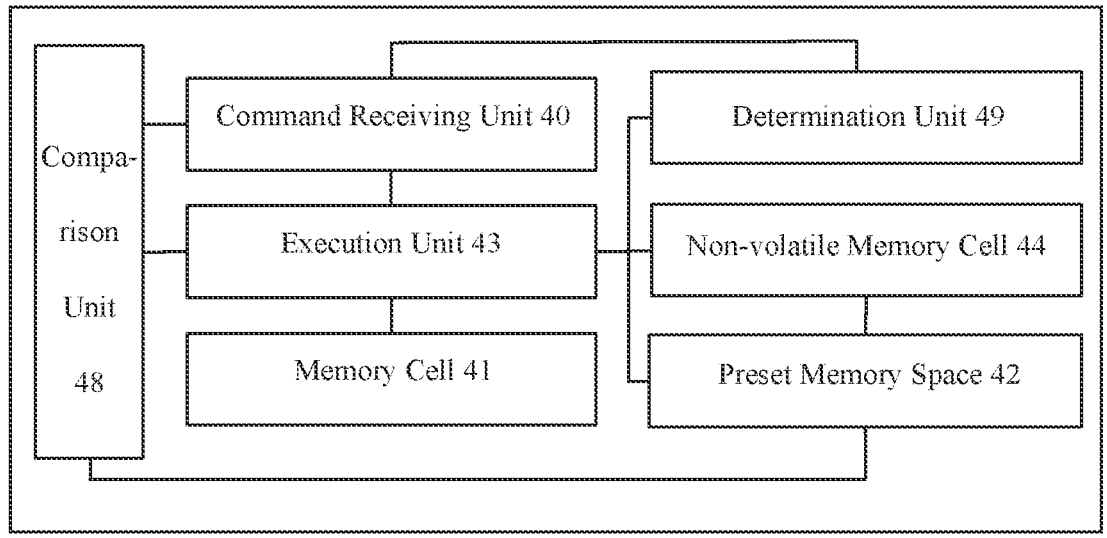
FIG. 8 is a schematic structural diagram of a memory device according to a fifth embodiment of the present disclosure.

The memory device of the present disclosure also provides a fifth embodiment. With reference to FIG. 8, a schematic structural diagram of the memory device according to the fifth embodiment of the present disclosure is illustrated. The fifth embodiment differs from the first embodiment in that the memory device also includes a comparison unit 48. The comparison unit 48 is connected to the command receiving unit 40 and the preset memory space 42, and the comparison unit 48 is configured to compare the address information pointed to by the read/write command with the address information stored in the preset memory space 42.

The execution unit 43 is also connected to the comparison unit 48, and the execution unit 43 is configured to perform a read/write operation on the memory cell corresponding to the address information pointed to by the read/write command, or to stop performing the read/write operation on the memory cell corresponding to the address information pointed to by the read/write command according to a result outputted by the comparison unit 48.

For example, the comparison unit 48 compares the address information pointed to by the read/write command with the address information stored in the preset memory space 42. If the address information pointed to by the read/write command is different from any address information stored in the preset memory space 42, the comparison unit 48 outputs a signal indicating DIFFERENT to the execution unit 43, such that the execution unit 43 performs, according to this signal, the read/write operation on the memory cell corresponding to the address information pointed to by the read/write command. If the address information pointed to by the read/write command is identical to the address information stored in the preset memory space 42, the comparison unit 48 outputs a signal indicating IDENTICAL to the execution unit 43, such that the execution unit 43 stops performing, according to this signal, the read/write operation on the memory cell corresponding to the address information pointed to by the read/write command.

Further, in the fifth embodiment, the memory device also includes a determination unit 49, wherein the determination unit 49 is connected to the command receiving unit 40 and the execution unit 43, and the determination unit 49 is configured to determine whether a write command has been executed on the address information pointed to by the read command after the address information pointed to by the read command is stored into the preset memory space 42. The execution unit 43 can perform the write operation on a corresponding memory cell according to an output result from the determination unit 49.

Figure 9:
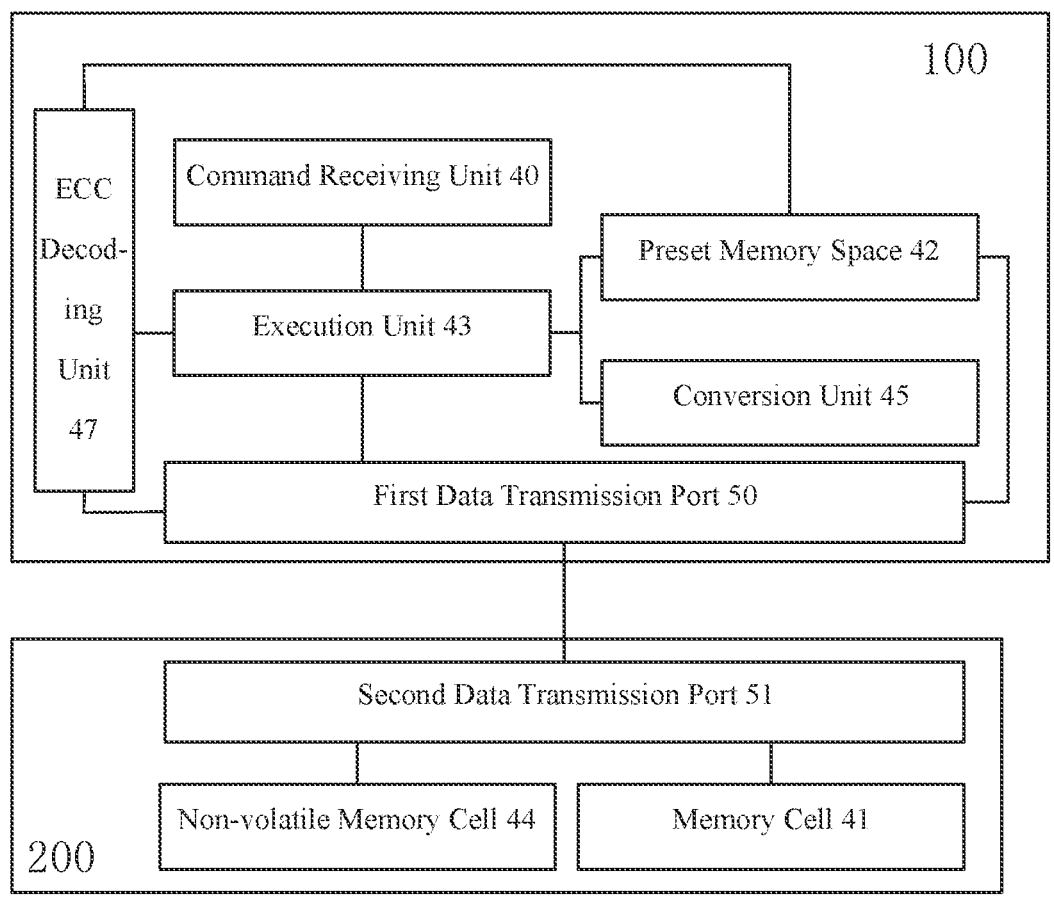
FIG. 9 is a schematic structural diagram of a memory device according to a sixth embodiment of the present disclosure.

The memory device of the present disclosure also provides a sixth embodiment. With reference to FIG. 9, a schematic structural diagram of the memory device according to the sixth embodiment of the present disclosure is illustrated. The sixth embodiment differs from the third embodiment in that the memory device also includes a logic layer 100 and a plurality of memory layers 200 (only one memory layer is shown in FIG. 9). The plurality of memory layers 200 may be DRAM chips. The plurality of memory layers 200 may be vertically stacked above or below the logic layer 100, but the present disclosure is not limited thereto. Furthermore, the plurality of memory layers 200 may be integrated together using other packaging methods.

The command receiving unit 40, the preset memory space 42, the execution unit 43, the ECC decoding unit 47 and the conversion unit 45 may be arranged in the logic layer 100. The memory cell 41 and the non-volatile memory cell 44 are arranged in the first memory layer 200. In another embodiment of the present disclosure, the preset memory space 42 and the ECC decoding unit 47 may also be arranged in the first memory layer 200, and the non-volatile memory cell 44 may be arranged in the logic layer 100.

In this embodiment, the logic layer 100 has at least one first data transmission port 50, and the first memory layer 200 has at least one second data transmission port 51. Instructions and data are transmitted between the logic layer 100 and the plurality of memory layers 200 through the first data transmission port 50 and the second data transmission port 51.

Further, in the sixth embodiment, the execution unit 43 not only is connected to the ECC decoding unit 47, but also is connected to the memory cell 41 through the first data transmission port 50 and the second data transmission port 51. However, in a seventh embodiment of the present disclosure, the execution unit 43 is connected to the ECC decoding unit 47, and the ECC decoding unit 47 is connected to the memory cell 41 through the first data transmission port 50 and the second data transmission port 51. It is to be understood that different connection relationships may be selected according to different needs.

Further, in other embodiments of the present disclosure, the comparison unit 48 and the determination unit 49 may also be arranged in the logic layer 100.

It is to be noted that although embodiments of the connection relationships are provided in the above drawings, the present disclosure does not limit the connection manner. It is to be understood that those skilled in the art may select different connection relationships according to different needs.

The memory device of the present disclosure can differentiate address information of an invalid memory cell from address information of a valid memory cell by using the preset memory space when the user uses the memory device, such that a read/write operation may be selectively performed on a memory cell. In this way, the reliability of the memory device is greatly improved, and the lifespan of the memory device is greatly prolonged. Further, according to the method for reading and writing provided by the present disclosure, the address information stored in the preset memory space is backed up into the non-volatile memory cell according to the preset rule, and the address information backed up in the non-volatile memory cell is loaded into the preset memory space after the memory device is powered on again. The address information loaded into the preset memory space serves as an initial reference for the subsequent read/write operation, which can prevent the address information having been stored in the preset memory space before the memory device is powered down from being re-stored in the preset memory space after the memory device is powered on again. In this way, the running speed of the memory device is greatly increased.

What is mentioned above merely refers to some embodiments of the present disclosure. It is to be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A method for reading and writing, comprising:
   applying a read command to a memory device, the read command pointing to address information;
   reading data to be read out from a memory cell corresponding to the address information pointed to by the read command; and
   storing the address information pointed to by the read command into a preset memory space if an error occurs in the data to be read out, and backing up the address information stored in the preset memory space into a non-volatile memory cell according to a preset rule;
   loading the address information backed up in the non-volatile memory cell into the preset memory space after the memory device is enabled;
   applying a write command to the memory device, and comparing address information pointed to by the write command with the address information stored in the preset memory space;
   performing a write operation on a memory cell corresponding to the address information pointed to by the write command if the address information pointed to by the write command is different from the address information stored in the preset memory space; and
   stopping performing the write operation on the memory cell corresponding to the address information pointed to by the write command if the address information pointed to by the write command is identical to the address information stored in the preset memory space.

2. The method for reading and writing according to claim 1, wherein the preset rule is a preset cycle or a preset action.

3. The method for reading and writing according to claim 1, wherein the address information pointed to by the read command is not stored in the preset memory space if no error occurs in the data to be read out.

4. The method for reading and writing according to claim 1, wherein the reading data to be read out from a memory cell corresponding to the address information pointed to by the read command further comprises: reading, from the memory cell corresponding to the address information pointed to by the read command, a first error correction code (ECC) corresponding to the data to be read out; and wherein a method for determining whether an error occurs in the data to be read out comprises: decoding the first ECC to determine whether the error occurs in the data to be read out.

5. The method for reading and writing according to claim 1, wherein after the stopping performing the write operation on the memory cell corresponding to the address information pointed to by the write command, the method for reading and writing further comprises: changing the address information pointed to by the write command to another address information.

6. The method for reading and writing according to claim 5, after the changing the address information pointed to by the write command to another address information, the method for reading and writing further comprises:
comparing the other address information with the address information stored in the preset memory space;
stopping performing the write operation on a memory cell corresponding to the other address information if the other address information is identical to the address information stored in the preset memory space; and
performing the write operation on the memory cell corresponding to the other address information if the other address information is different from the address information stored in the preset memory space.

7. The method for reading and writing according to claim 1, wherein the performing a write operation on the memory cell corresponding to the address information pointed to by the write command further comprises:
forming a second ECC corresponding to data to be written in the write operation, and writing the second ECC together with the data to be written into the memory cell corresponding to the address information pointed to by the write command.

8. The method for reading and writing according to claim 1, wherein after the applying a read command to the memory device, and before the reading data to be read out from a memory cell corresponding to the address information pointed to by the read command, the method further comprises:
comparing the address information pointed to by the read command with the address information stored in the preset memory space; and
performing a read operation on the memory cell corresponding to the address information pointed to by the read command if the address information pointed to by the read command is different from the address information stored in the preset memory space.

9. The method for reading and writing according to claim 8, comprising:
determining, if the address information pointed to by the read command is identical to the address information stored in the preset memory space, whether a write command has been executed on the address information pointed to by the read command after the address information pointed to by the read command is stored in the preset memory space; and
pointing the read command to address information pointed to by the write command to perform a read operation on a memory cell corresponding to the address information pointed to by the write command if a determination result is yes.

10. A memory device, comprising:
a command receiving unit, configured to receive a read/write command;
a memory cell, configured to correspond to address information pointed to by the read/write command;
an execution unit, configured to perform a read/write operation on the memory cell;
a preset memory space, configured to store address information corresponding to a memory cell with data error;
a non-volatile memory cell, configured to back up the address information stored in the preset memory space according to a preset rule; and
a comparison unit, wherein the comparison unit is connected to the command receiving unit and the preset memory space, and the comparison unit is configured to compare the address information pointed to by the read/write command with the address information stored in the preset memory space;
wherein the execution unit is further connected to the comparison unit, and the execution unit is configured to perform a read/write operation on the memory cell corresponding to the address information pointed to by the read/write command, or to stop performing the read/write operation on the memory cell corresponding to the address information pointed to by the read/write command according to a result outputted by the comparison unit.

11. The memory device according to claim 10, further comprising a loading unit, wherein the loading unit is connected to the preset memory space and the non-volatile memory cell, and the loading unit is configured to load the address information backed up in the non-volatile memory cell into the preset memory space.

12. The memory device according to claim 10, further comprising an ECC decoding unit, configured to decode a first ECC corresponding to data to be read out in the read operation and to form a second ECC corresponding to data to be written in the write operation.

13. The memory device according to claim 10, further comprising a determination unit, wherein the determination unit is connected to the command receiving unit and the execution unit, and the determination unit is configured to determine whether a write command has been executed on the address information pointed to by the read command after the address information pointed to by the read command is stored in the preset memory space.

14. The memory device according to claim 10, further comprising a conversion unit, wherein the conversion unit is configured to change the address information pointed to by the read/write command to another address information after stopping performing the read/write operation on the memory cell corresponding to the address information pointed to by the read/write command.

15. The memory device according to claim 10, comprising a logic layer and at least one memory layer, wherein the command receiving unit and the execution unit are arranged in the logic layer, the preset memory space being arranged in the logic layer or the memory layer, the memory cell being arranged in the memory layer, and the non-volatile memory cell being arranged in the memory layer or the logic layer.

* * * * *